(12) United States Patent
Zhang et al.

(10) Patent No.: US 11,387,275 B2
(45) Date of Patent: Jul. 12, 2022

(54) MONOLITHIC MULTI-CHIP-COLLECTIVE LIGHT-EMITTING DIODE

(71) Applicant: BOLB INC., San Jose, CA (US)

(72) Inventors: Jianping Zhang, San Jose, CA (US); Ling Zhou, San Jose, CA (US); Alexander Lunev, San Jose, CA (US); Ying Gao, San Jose, CA (US)

(73) Assignee: BOLB INC., Livermore, CA (US)

( * ) Notice: Subject to any disclaimer, the term of this patent is extended or adjusted under 35 U.S.C. 154(b) by 0 days.

(21) Appl. No.: 16/984,564

(22) Filed: Aug. 4, 2020

(65) Prior Publication Data
US 2022/0045121 A1 Feb. 10, 2022

(51) Int. Cl.
*H01L 27/15* (2006.01)

(52) U.S. Cl.
CPC .................. *H01L 27/156* (2013.01)

(58) Field of Classification Search
CPC ...... H01L 27/156; H01L 27/15; H01L 33/387; H01L 33/62
See application file for complete search history.

(56) References Cited

U.S. PATENT DOCUMENTS

2017/0256520 A1* 9/2017 Moon ................ H01L 33/62

* cited by examiner

*Primary Examiner* — Changhyun Yi
(74) *Attorney, Agent, or Firm* — J.C. Patents

(57) ABSTRACT

A high-power light-emitting diode is made by monolithically integrating multiple miniature light-emitting chips for improved operation voltage, light extraction efficiency and device yield. The light emitting diode includes a plurality of monolithically integrated mini chips, each of the mini chips has a mini n-contact formed on an n-type structure, a mini p-ohmic contact formed on a p-type structure, and a mini light emitting area defined by the mini p-ohmic contact. An n-bridge metal electrically connecting the mini n-contact of the mini chips to an n-bonding pad, the n-bridge metal is formed on the p-type structure and on sidewall of an opening in the p-type structure and on the active-region.

20 Claims, 11 Drawing Sheets

US 11,387,275 B2

MONOLITHIC MULTI-CHIP-COLLECTIVE LIGHT-EMITTING DIODE

1. Field of the Invention

The present disclosure relates in general to semiconductor light emitting technology and, more particularly, to high-power light-emitting diode made by monolithically integrating multiple miniature light-emitting chips for improved operation voltage, light extraction efficiency and device yield.

2. Description of the Related Art

Nitride compound semiconductors such as InN, GaN, AlN, and their ternary and quaternary alloys depending on alloy composition enable ultraviolet (UV) emissions ranging from 410 nm approximately to 200 nm. These include UVA (400-315 nm), UVB (315-280 nm), and part of UVC (280-200 nm) emissions. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity and dosage, facilitating an ideal disinfection/sterilization treatment for water, air, foods and object surfaces. Further, the light output of nitride UV light emitters can be modulated at high frequencies up to a few hundreds of mega-hertz, promising them to be innovative light sources for Internet of Things, covert communications and bio-chemical detections.

The state-of-the-art UV light-emitting diodes (LEDs) commonly adopt a laminate structure containing a substrate, an n-type AlGaN (n-AlGaN) structure, an AlGaN-based quantum well active-region such as single quantum well or multiple quantum well (collectively, MQW), and a p-type AlGaN (p-AlGaN) structure. The n-AlGaN and p-AlGaN structures respectively inject electrons and holes into MQW active-region for light-generation. An AlGaN structure may consist of a few AlGaN layers formed as a structure to perform better functionalities than a single AlGaN layer. For example, an AlGaN structure can be made of a few AlGaN layers of different doping levels and/or of different composition profiles so as to have better electrical conductivity and carrier confinement. The substrate can be made of UV-transparent (c-plane) sapphire or AlN. An AlN layer can be optionally coated over substrate serving as epitaxial template.

In epidemic and pandemic events, high-power UVC LEDs are of particular interest, in view of their capability to perform quick sterilization/disinfection functions. High-power UVC LEDs require large chip size and light-emitting area in order to handle high current injection. For UVC LEDs, the n-AlGaN structure is of Al-content more than 55%, around 60%, relatively resistive and not suitable for spreading current in large area. Further, larger chip LEDs suffer more light extraction loss due to prolonged lateral light propagation and increased absorption within the chip. New device schemes are desired to make efficient high-power LEDs, such as high-power UVC LEDs with improved light extraction efficiency and current spreading (hence lower voltage).

High-power LEDs and high-power UV LEDs are referred to LEDs consuming electrical power 1 watt or more and having output optical power 50 mW or more depending on LED's optical electrical conversion efficiency.

3. SUMMARY

The present disclosure provides a monolithic multi-chip-collective light emitting diode which includes:

an n-type structure, a p-type structure, and an active-region sandwiched between the n-type structure and the p-type structure;

a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;

an n-bridge metal electrically connecting the mini n-contact of each of the mini chips to an n-bonding pad, wherein the n-bridge metal is formed on the p-type structure and on sidewall of the opening in the p-type structure and the active-region.

4. BRIEF DESCRIPTION OF THE DRAWINGS

The accompanying drawings, which are included to provide a further understanding of the disclosure and constitute a part of this application, illustrate embodiments of the disclosure and together with the description serve to explain the principle of the disclosure. Like reference numbers in the figures refer to like elements throughout, and a layer can refer to a group of layers associated with the same function.

5. DETAILED DESCRIPTION OF EMBODIMENTS

Figure 1:
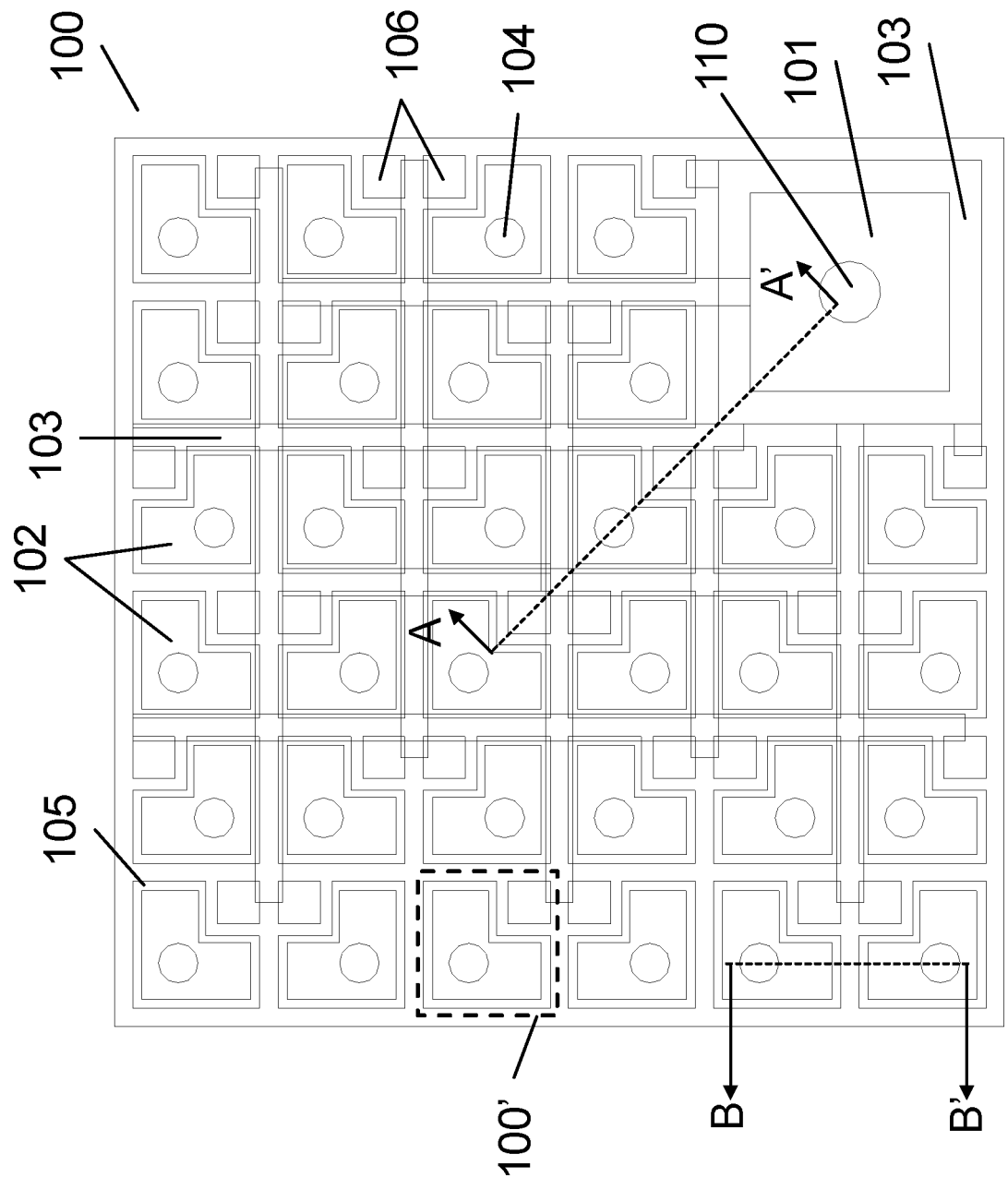
FIG. 1 illustrates a plan-view layout of a monolithic multiple-chip-collective light-emitting diode chip according to an embodiment of the present disclosure.

In the following description, nitride UV LEDs are used as examples to elucidate the principles of this invention. It is understood that the invention can be extended to LEDs made of other materials as well and LEDs with different wavelength than UV light.

Throughout the specification, the term group III nitride in general refers to metal nitride with cations selecting from group IIIA of the periodic table of the elements. That is to say, III-nitride includes AN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \le 10\%$.

As mentioned previously, large size lateral LEDs with limited n-type conduction have current spread issue which can severely limits LED's light output power and lifetime because of localized high current density. The current density distributes around p-ohmic contact edge according to equation:

$$J(x) = J(0)e^{-\frac{x}{L}},$$

where $J(x)$ is current density at x within p-ohmic contact, distanced from p-ohmic contact edge neighboring to n-ohmic contact, and L is current spread length:

$$L = t_n\sqrt{\frac{R_p}{R_n}},$$

where $t_n$ is the thicknesses of the n-semiconductor layer, and $R_p$ and $R_n$ are respectively the resistances from p-side and n-side of the LED. For UVC LEDs, the n-AlGaN structure of high Al-content (around 60%) and limited thickness (2-4 microns, due to strain-related cracking issue) possesses inferior electrical conduction and small current spread length (less than 50 microns).

One aspect of the present disclosure is to provide large-area ($\ge 1$ mm$^2$, such as 1-5 mm$^2$) chip designs for high-power LEDs, especially high-power UV LEDs. To facilitate the following discussion and description in this specification, it is defined that an n-contact includes at least an n-ohmic contact (metal layer), and optionally with a thick n-metal overlying on top of the n-ohmic contact for probing or connection to external power source. Similarly, a p-contact includes at least a p-ohmic contact (metal layer), and optionally with a thick p-metal overlying on top of the p-ohmic contact for probing or connection to external power source.

As well known, nitride light emitting devices such as light emitting diodes (LEDs) and laser diodes, commonly adopt a laminate structure containing a quantum well active region or, a multiple-quantum-well (MQW) active region, an n-type nitride (or, n-nitride) structure for injecting electrons into the active region, and a p-type nitride (or, p-nitride) structure on the other side of the active region for injecting holes into the active region. For lateral injection LEDs, n-ohmic contact is formed on n-type nitride structure. To selectively expose n-type nitride structure for n-contact formation, a lithographic process is used to define an area of exposure (for etching) and a complementary area of protection (against etching), and an etch process is used to remove p-type nitride structure, MQW active-region, and part of n-type nitride structure in the defined area of exposure. Besides exposing n-type nitride structure, this selective etching process also simultaneously defines and forms p-mesas (which will be covered by p-contacts later on upon p-contact formation process) in the area of protection. Since the light-emitting area of a lateral injection LED is totally contained in its p-mesas, the p-mesa can thus be called as light-emitting mesa.

Figure 2A:
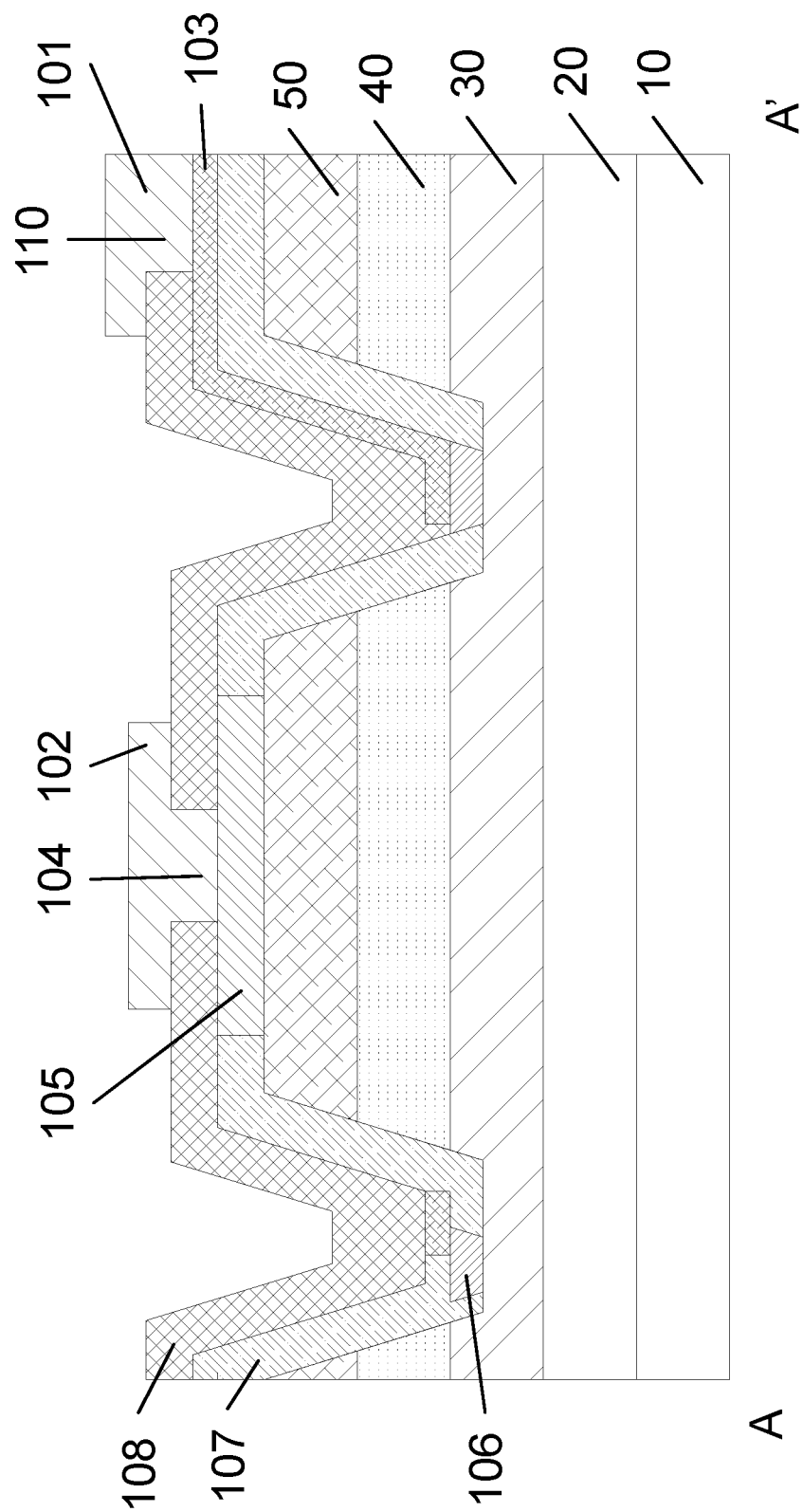
FIG. 2A illustrates the cross-sectional view of the chip taken along AA' cut shown in FIG. 1.

FIG. 1 illustrates a plan-view layout of a monolithic multiple-chip-collective light-emitting diode (mC$^2$ LED) chip 100 according to an embodiment of the present disclosure. As seen, LED chip 100 is made by monolithically integrating multiple unit cell mini LED chips 100' (or mini chip 100'). Each mini chip 100' contains a mini n-contact 106, and a light emitting area defined by a mini p-ohmic contact 105. This is possible since the p-semiconductor structure of an LED is more resistive and practically no p-type current injection is possible beyond the mini p-ohmic contacts. More features of chip 100 can be revealed in the cross-sectional view of the chip taken along AA' cut in FIG. 1, which is shown in FIG. 2A. As seen, chip 100 (hence mini chip 100') contains a substrate 10, an epitaxial template 20, an n-AlGaN structure 30, an AlGaN MQW 40 as the light-emitting active region, and a p-AlGaN structure 50. In other words, all mini chips 100' share the substrate 10, the epitaxial template 20, the n-AlGaN structure 30, the AlGaN MQW 40, and the p-AlGaN structure 50. It is noted that substrate 10 can be of any suitable substrate, such as sapphire, AlN, SiC and the like. Mini re-contact 106 is deposited on n-AlGaN structure 30, to form metal-n-AlGaN ohmic contact, and mini p-ohmic contact 105 is deposited on p-AlGaN structure 50, to form metal-p-AlGaN ohmic contact, through respective openings in the first dielectric layer 107. The first dielectric layer 107 is formed on p-AlGaN structure 50 and also covers sidewalls of the openings in p-AlGaN structure 50 and AlGaN MQW 40, which openings expose the n-type structure, and mini n-contacts 106 are formed on the n-type structure exposed by the openings. The metal scheme for mini n-contact 106 can be selected from Ti/Al/Ti/Au, V/Al/V/Ag, V/Al/V/Au, and V/Al/Ti/Au, of respective thicknesses such as 20 nm/60 nm/20 nm/100 nm. The metal scheme for mini p-ohmic contact 105 can be Ni/Au (5-10 nm/100-200 nm), or Ni/Rh (0.2-0.6 nm/50-100 nm).

Mini Chip 100' contains a mini p-bonding pad 102, which is formed on a second dielectric layer 108 and contacts mini p-ohmic contact 105 through an opening 104 in the second dielectric layer 108 as shown in FIG. 2A.

Chip 100 contains an n-bonding pad 101, which is formed on the second dielectric layer 108 and contacts n-bridge metal 103 through an opening 110 in the second dielectric layer 108. N-bridge metal 103 forms a metal interconnection network, running on the first dielectric layer 107 and connecting all the mini n-contacts 106 to n-bonding pad 101. N-bridge metal 103 is formed on the first dielectric layer 107 and contacts the mini n-contacts 106 through the openings in p-AlGaN structure 50 and AlGaN MQW 40 which openings expose the n-type structure. In other words, the first dielectric layer 107 at least partially exposes each mini n-contact 106 so that n-bridge metal 103 can connect to the exposed mini n-contact 106. The second dielectric layer 108 is largely formed on n-bridge metal 103, mini p-ohmic contacts 105, and the first dielectric layer 107.

For operation, chip 100 can be flip-chip bonded to a submount (not shown in FIG. 1), which possesses an n-bonding pad and a p-bonding pad electrically isolated from the n-bonding pad. The n- and p-bonding pads on the submount are then respectively (eutectic) bonded to n-bonding pad 101 and mini p-bonding pads 102 (all mini chips 100' on chip 100 will therefore be in parallel connection then). The n- and p-bonding pads on the submount can then be connected to a negative (or ground) and a positive voltage output from a circuit or power supply, respectively. During operation, the voltage drop will drive n-current (electrons) from the n-bonding pad on the submount to n-bonding pad 101, to n-bridge metal 103, to mini n-contacts 106, to n-AlGaN structure 30, to MQW 40. Likewise, p-current (holes) is injected from the p-bonding pad on the submount to mini p-bonding pads 102, to mini p-ohmic contacts 105, to p-AlGaN structure 50, to MQW 40. And the injected electrons and holes take radiative recombination to radiate light from MQW 40.

Figure 2B:
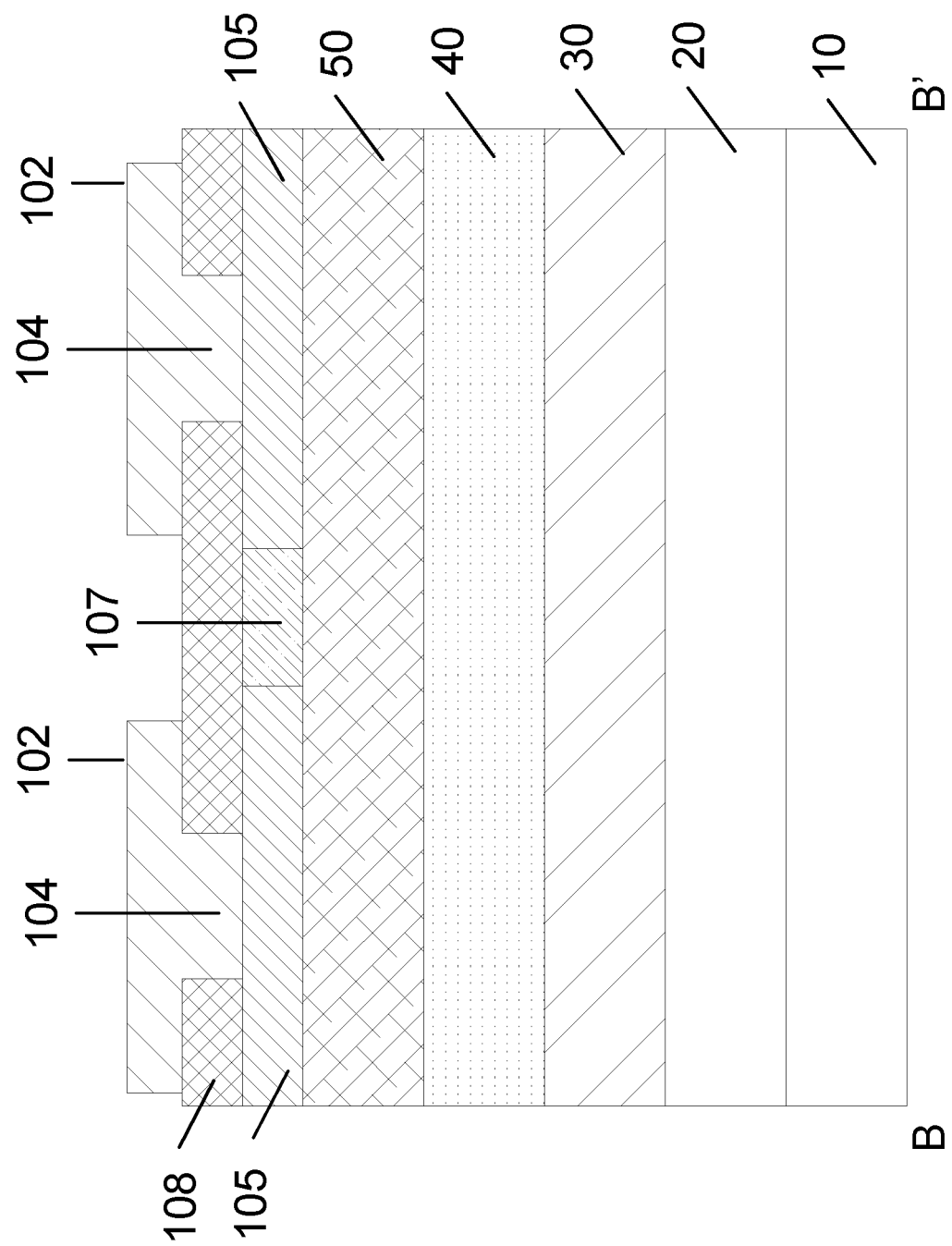
FIG. 2B illustrates the cross-sectional view of the chip taken along BB' cut shown in FIG. 1.

Also, seen from FIG. 1, as the light-emitting areas are totally defined by mini p-ohmic contacts 105, thanks to the negligible hole injection beyond mini p-ohmic contacts 105, there is no need to etch and remove p-AlGaN structure 50 and MQW 40 in the regions in-between neighboring mini p-ohmic contacts 105. This is shown in FIG. 2B, a cross-sectional illustration taken along the BB' cut in FIG. 1. These regions in-between neighboring mini p-ohmic contacts 105 can be covered with the first dielectric layer 107 for n-bridge metal 103 to run upon, and n-bridge metal 103 can form an omnidirectional reflector to enhance light extraction efficiency for the LED. Thus, n-bridge metal 103 can be formed in the regions in-between neighboring mini p-ohmic contacts 105 in the form of network.

Figure 3:
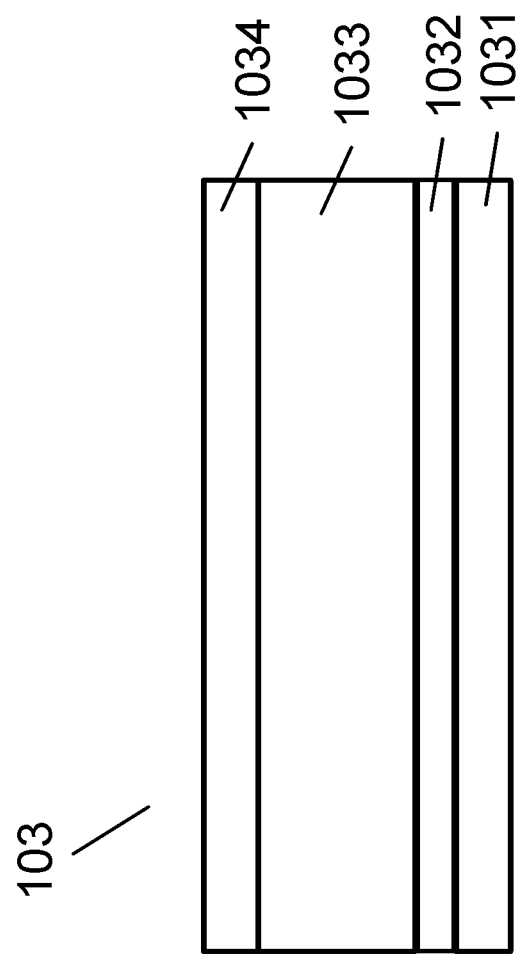
FIG. 3 illustrates the cross-sectional view of an n-bridge metal according to an embodiment of the present disclosure.

For this purpose, the (bottom) surface of n-bridge metal 103 facing p-AlGaN structure 50 is preferably light reflective, for example, UV light and UVC light reflective. The cross-sectional view of n-bridge metal 103 in an embodiment is illustrated in FIG. 3. As seen, it contains at least 4 layers of metals. The bottom layer 1031, facing p-AlGaN structure 50 and residing on the first dielectric layer 107, is light reflective, optionally made of metal aluminum (Al), or aluminum magnesium (Al:Mg) alloy. Layer 1031 is intended to reflect light so it should be thick enough to forbid light penetration. For example, its thickness can be at least 10 nm, or thicker than 50 nm, such as 20-100 nm. Layer 1032 is a metal diffusion blockage layer, optionally made of thin nickel (Ni) of more than 2 nm thick, such as 5 nm or more, for example, 2-10 nm. Layer 1033 is intended for current conduction, so it is preferably made of thick metals such as gold (Au), silver (Ag), or copper (Cu), with thickness greater than 2 microns, such as 4-6 microns. Finally, on top of layer 1033 is layer 1034, intended for good adhesion for dielectric layer (such as the second dielectric layer 108) to passivate n-bridge metal 103. Layer 1034 can be made of thin (e.g. 1-5 nm) chromium (Cr) and palladium (Pd) or their alloys. To balance light emitting and current spreading functions, n-bridge metal 103 can cover 20%-40% of the total area of chip 100, such as 25%-35% of the total area of chip 100.

N-bridge metal 103 forms a metal interconnection network running primarily on the first dielectric layer 107 in-between neighboring mini p-ohmic contacts 105, providing uniform currents from n-bonding pad 101 to all mini n-contacts 106. Thus, via regulating chip size of mini chip 100', chip 100 can eliminate or significantly alleviate current crowding issue for large-size high-power LEDs. The chip size of mini chip 100' can be in the range of 10-300 microns, such as 20-150 microns, or 30-90 microns. Chip 100 can be a large-area chip with a chip area equal to or larger than 1 mm². Mini chips 100' in a chip 100 may take any proper shape, such as square and rectangular shape, and may have the same shape and size, or different shape and size. Further, n-bridge metal 103 being light reflective and running on the first dielectric layer 107 may form an omnidirectional reflector (ODR), greatly enhancing light extraction efficiency. When forming ODR, in some embodiments, the first dielectric layer 107 is transparent to the light emitted by MQW 40, and preferably made of UV transparent dielectrics such as silicon dioxide ($SiO_2$), aluminum oxide ($Al_2O_3$), yttrium oxide ($Y_2O_3$), magnesium fluoride ($MgF_2$), calcium fluoride ($CaF_2$), and the like. Note that an ODR is a triple-layer optical reflector including a semiconductor with a larger refractive index, a transparent dielectric layer with a lower refractive index, and a metal with a complex refractive index. The dielectric layer in the ODR is preferably to be of quarter wavelength thickness, i.e., $$\frac{\lambda_0}{4n}$$

(here n is the refractive index of the dielectric layer, $\lambda_0$ is light wavelength measured in vacuum). For example, for UVC LEDs with emissions at 280 nm, with silicon dioxide ($SiO_2$) as the dielectric layer, then the preferred $SiO_2$ thickness in the ODR is 46.85 nm (n=1.492 at 280 nm). When the first dielectric layer 107 is made of a UV transparent dielectric layer, its thickness can be in the range of 30-300 nm, or, 40 to 200 nm, or 42-90 nm, or optionally to be of quarter wavelength thickness.

In another embodiment, the first dielectric layer 107 is UV reflective, optionally with UV reflectivity greater than 90%. For example, it can be a UV Distributed Bragg Reflector (DBR). DBRs are periodic structures with a unit cell of two dielectric layers having different refractive indices ($n_1$, $n_2$) and quarter-wavelength thicknesses $$(d_1, d_2)\left(d_i = \frac{\lambda_0}{4n_i}, i = 1, 2\right).$$

The reflectivity of a DBR usually increases as the number of the repeating unit cell in the DBR increases. For example, the first dielectric layer 107 can be made of periodically alternatively stacked UV transparent dielectrics (with different refractive indexes), such as $SiO_2/Al_2O_3$, $SiO_2/Y_2O_3$, $SiO_2/MgF_2$, or $CaF_2/MgF_2$ DBR. When the first dielectric layer 107 is made of a UV DBR, its thickness can be in the range of 100-3000 nm (i.e., DBR of 1 to 30 pairs of unit cells), such as 1000-2000 nm. When the first dielectric layer 107 is UV reflective, n-bridge metal 103 can be light or UV light non-reflective, and made of gold, gold tin, silver, aluminum, and copper, et al with a single layer or multilayer structure.

The second dielectric layer 108 can be UV transparent, or opaque, made of the similar dielectric material as the first dielectric layer 107. The thickness of the second dielectric layer 108 can be in the range of 100-500 nm, such as 200-400 nm.

If the size is still too large for uniform current spreading, mini chip 100' can be made of a set of monolithically integrated micro chips 100'', in a similar way like mC² chip 100 is made of mini chips 100'. In some embodiments, mini chip 100' is substantially a fractal of mC² chip 100.

Figure 4:
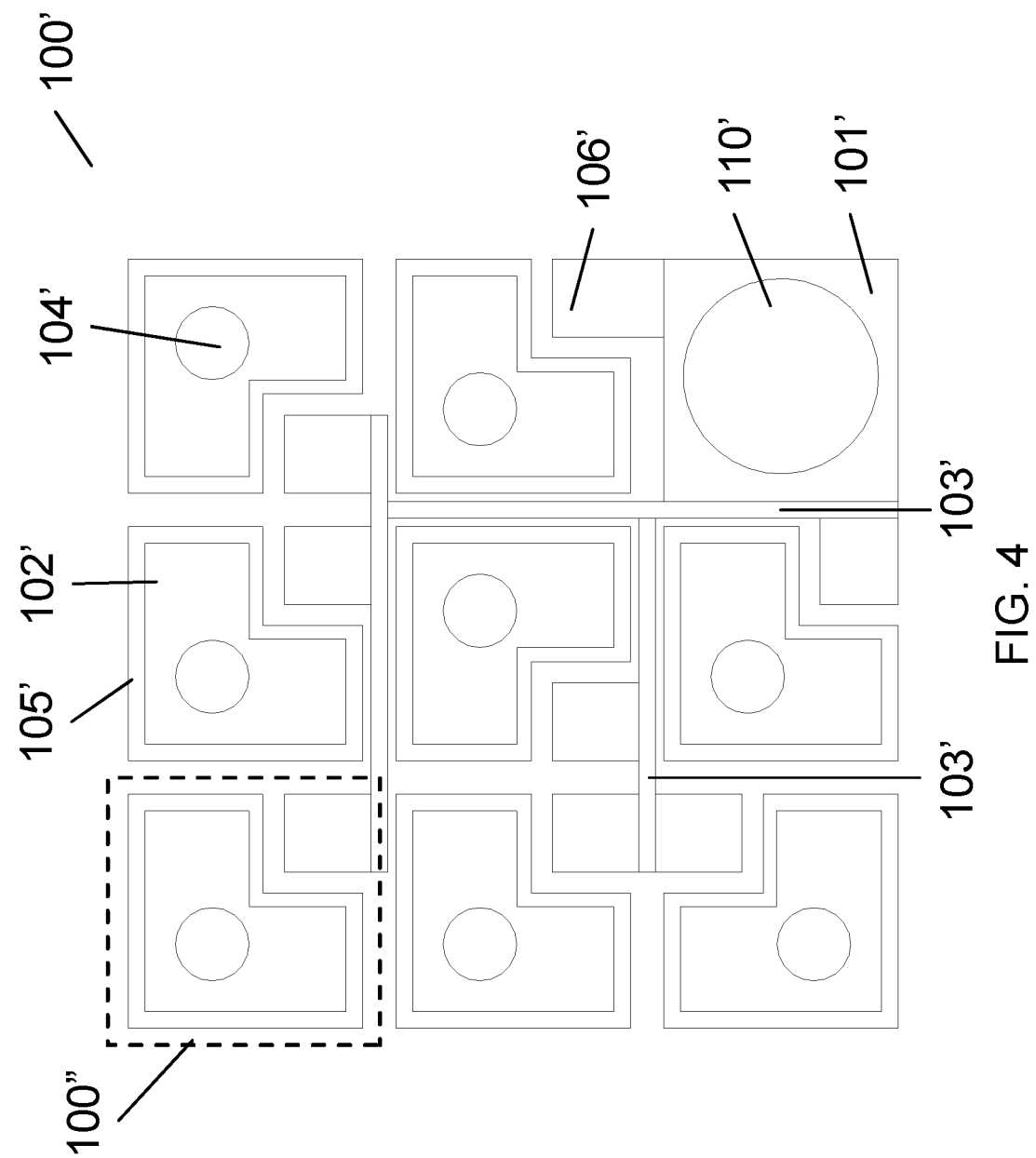
FIG. 4 illustrates a plan-view chip design for the mini LED chip as shown in FIG. 1.

Shown in FIG. 4 is a plan-view layout design for an embodiment of mini chip 100'. As seen, mini chip 100' in FIG. 4 is made of a set of monolithically integrated micro chips 100''. Each micro chip 100'' has a micro n-contact 106', a micro p-ohmic contact 105' defining a micro light emitting area, a micro p-bonding pad 102' connecting to micro p-ohmic contact 105' via a micro opening 104' in the second dielectric layer 108. Mini chip 100' further contains a mini n-contact pad 101' and a mini n-bridge metal 103', which forms a metal interconnection network connecting mini n-contact pad 101' and all micro n-contacts 106'. Mini n-contact pad 101' can function as a mini n-contact 106 in FIG. 1, receiving current from n-bridge metal 103 and distribute current via mini n-bridge metal 103' to all micro n-contacts 106'. Although not explicitly shown in FIG. 4, mini n-bridge metal 103' runs on the first dielectric layer 107, being preferably UV reflective, just like n-bridge metal 103. The chip size of micro chip 100'' can be in the range of 5-100 microns, for example, 10-60 microns.

Figure 5:
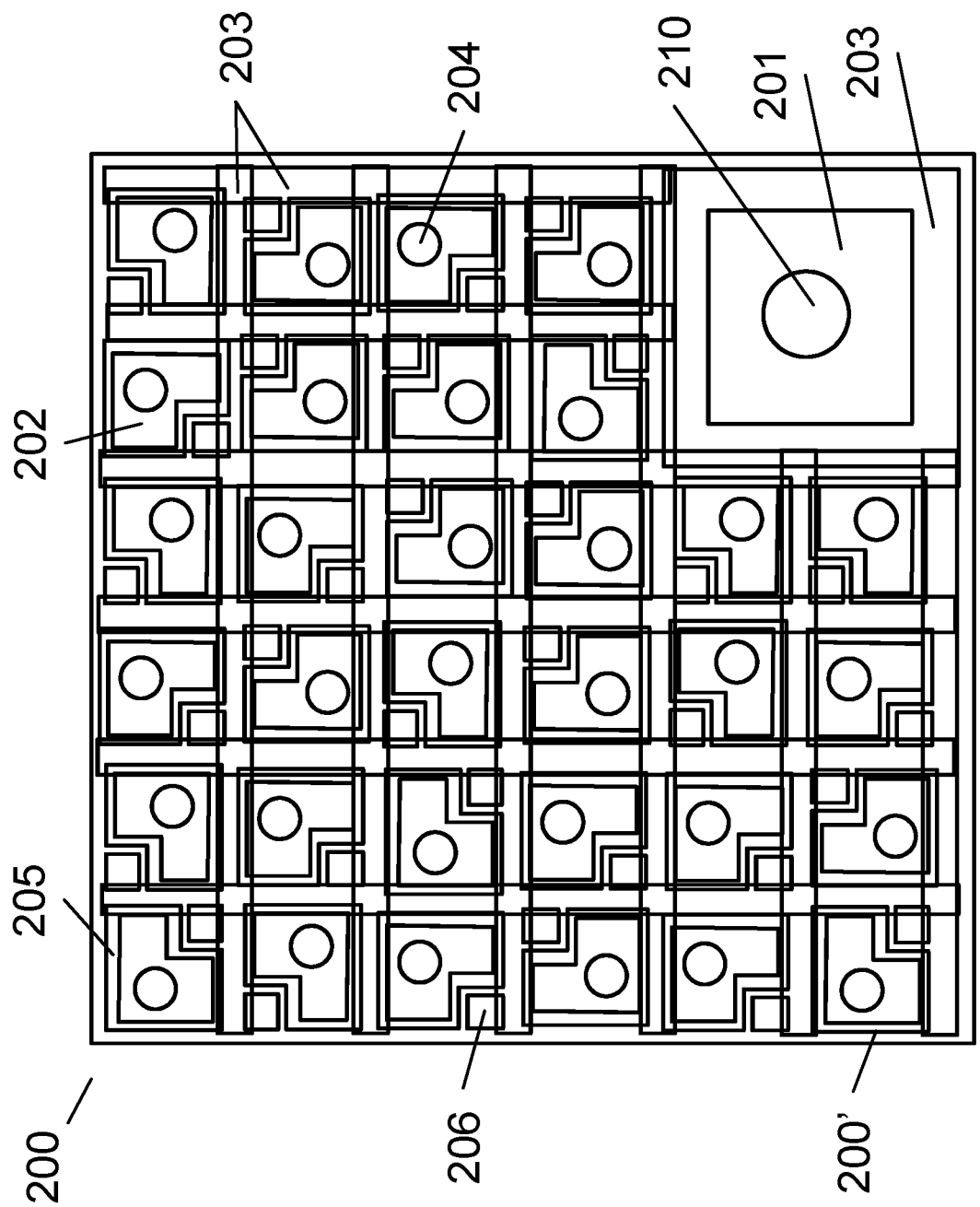
FIG. 5 illustrates a plan-view layout of a monolithic multiple-chip-collective light-emitting diode chip according to another embodiment of the present disclosure.

FIG. 5 illustrates a plan-view layout of another monolithic multiple-chip-collective light-emitting diode (mC² LED) chip 200. As seen, chip 200 having the same constituent components as chip 100, is made by monolithically integrating multiple mini chip 200'. Each mini chip 200' contains a mini n-contact 206, a mini p-bonding pad 202, and a mini light emitting area defined by a mini p-ohmic contact 205. Mini p-bonding pad 202 is formed on the second dielectric layer and contacts mini p-ohmic contact 205 through opening 204 in the second dielectric layer. A distinguishing feature of chip 200 as compared to chip 100 is the strict separation of mini n-contacts 206, i.e., there are no mini n-contacts 206 clustering together. In some embodiments, the separation distance between any mini n-contacts 206 is at least about the size of the mini chip 200' itself. In the present disclosure, the size of a chip is referred to its lateral dimensions, such as its width, or length, instead of its vertical dimension along epitaxial growth direction. In chip 100, there are occasions where two mini n-contacts 106 neighbor each other. As such, chip 200 provides better current spreading. Also, n-bridge metal 203 connecting n-bonding pad 201 and all mini n-contacts 206 forms larger interconnection network, running on all the row and column streets between neighboring mini chips 200', providing more uniform current spreading and better light extraction for chip 200. N-bonding pad 201 contacts n-bridge metal 203 through opening 210 in the second dielectric layer. As shown in FIG. 5, in some embodiments, the mini chips 200' have the same size and a square or rectangular shape when viewed from top, a mini n-contact 206 is formed at a corner of each of the mini chips 200', respectively, and corners of neighboring mini chips occupied by mini n-contacts 206 are not adjacent to each other. In other words, the corner of a mini chip that is adjacent to a mini-contact bearing corner of a neighboring mini chip is not occupied by a mini n-contact. The term "adjacent corners" of neighboring mini chips as used here means two corners with the shortest distance.

Figure 6:
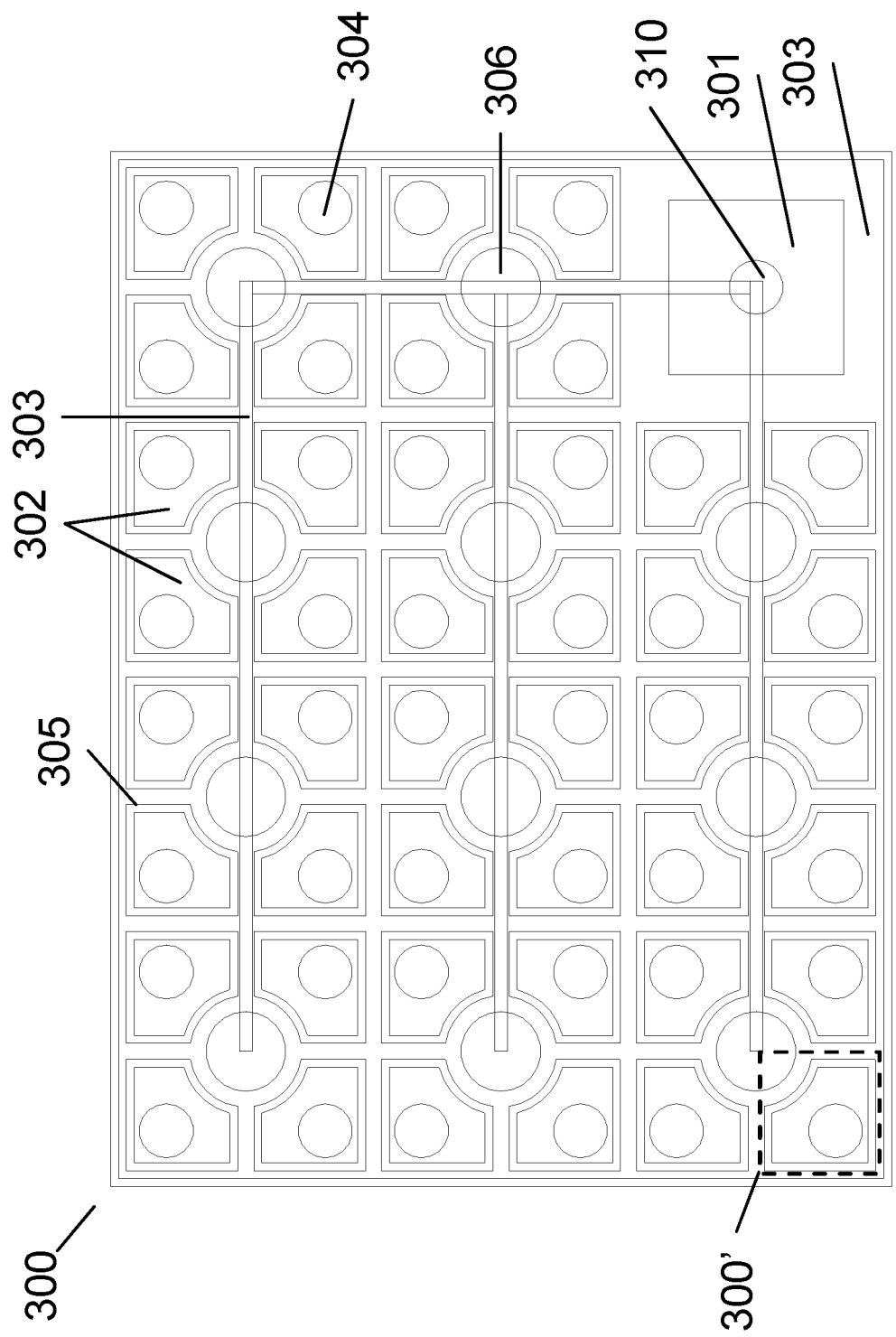
FIG. 6 illustrates a plan-view layout of a monolithic multiple-chip-collective light-emitting diode chip according to another embodiment of the present disclosure.

In yet another embodiment, (mC² LED) chip 300 shown in FIG. 6 is similar to chip 100 in structure, however, every four neighboring mini chips 300' have their respective mini n-contacts clustered and merged into a single mini n-contact 306. In other words, four mini n-contacts are formed in adjacent corners of four neighboring mini chips 300', respectively, and merge into a single mini n-contact 306. As a result, chip 300 may not have the best current spread capability. However, by merging 4 individual mini n-contacts into one single mini n-contact 306, total mesa edge perimeter reduces and light emitting area may increase. In the embodiment shown in FIG. 6, n-bonding pad 301, mini p-bonding pad 302, n-bridge metal 303, openings 304 in the second dielectric layer, mini p-ohmic contact 305, and opening 310 in the second dielectric layer are similar to the corresponding components of chip 100 shown in FIG. 1.

Figure 7:
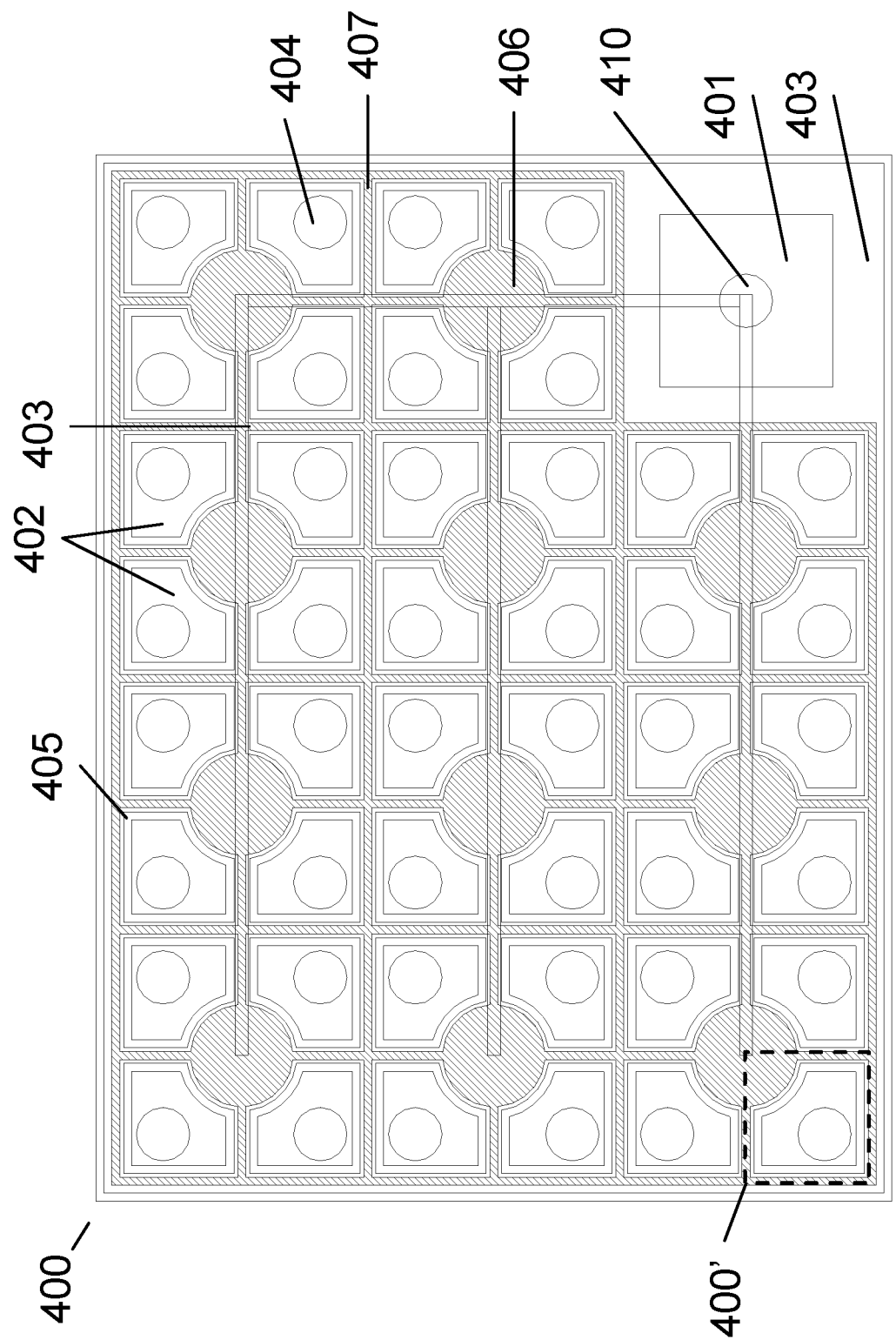
FIG. 7 illustrates a plan-view layout of a monolithic multiple-chip-collective light-emitting diode chip according to another embodiment of the present disclosure.

Chip 400 shown in FIG. 7 is a modification of chip 300 shown in FIG. 6, adding mini n-spread contact 407 to surround each mini chip 400'. The mini n-spread contact 407 is formed as a fin type extension of mini n-contact 406. N-current will be delivered by n-bridge metal 403 from n-bonding pad 401 to mini n-contacts 406. Further, n-spread contact 407 will help to spread n-current from mini n-contact 406 to each mini chip 400'. The mini n-spread contact 407 formed as an extension of mini n-contact 406 is deposited on and form ohmic contact to n-AlGaN structure 30. The metal scheme for mini n-spread contact 407 therefore can be the same as that for mini n-contact 406, i.e., it can be selected from Ti/Al/Ti/Au, V/Al/V/Ag, V/Al/V/Au, and V/Al/Ti/Au, of respective thicknesses such as 20 nm/60 nm/20 nm/100 nm.

Figure 8:
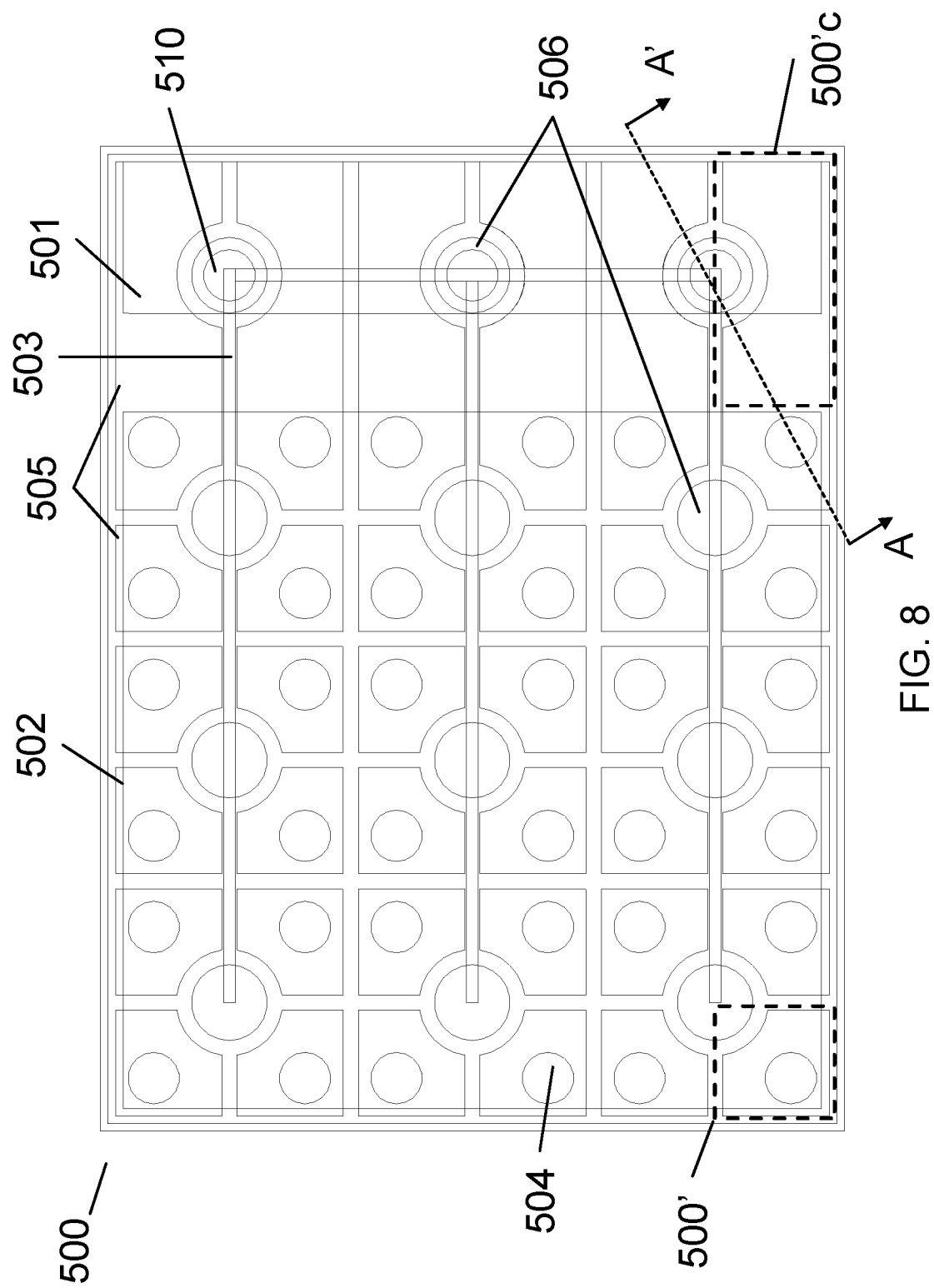
FIG. 8 illustrates a plan-view layout of a monolithic multiple-chip-collective light-emitting diode chip according to another embodiment of the present disclosure.
Figure 9:
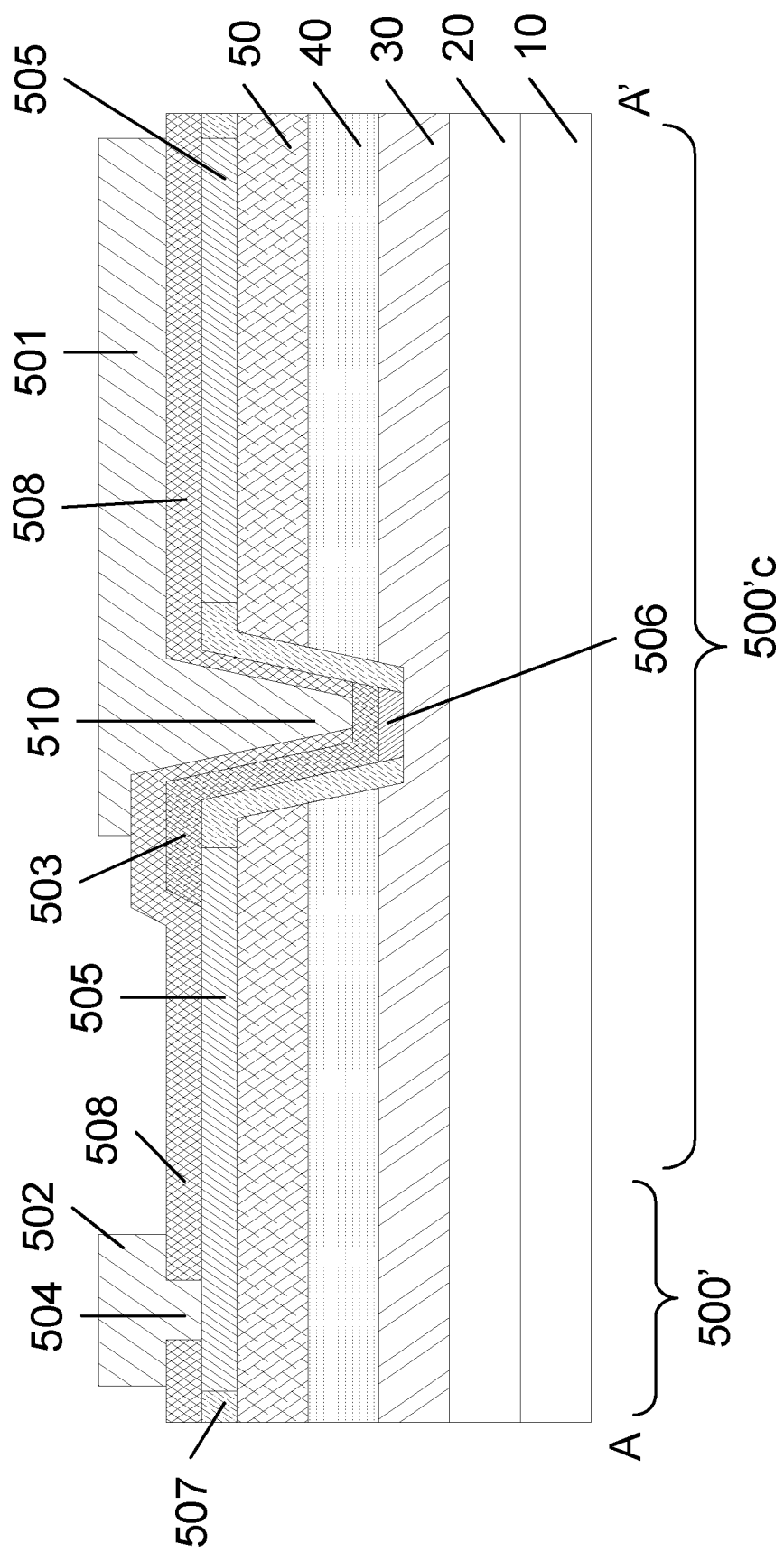
FIG. 9 illustrates the cross-sectional view of the chip taken along AA' cut shown in FIG. 8.

Presented in FIG. 8 is the plan-view layout of chip 500, another modification of chip 300 shown in FIG. 6, prominently differing in the n-bonding pad 501 (as compared to n-bonding pad 301). Chip 500 is monolithically made of multi mini chips 500' and multi mini chips 500'c. And a mini chip 500'c is made by joining mini p-ohmic contacts of two neighboring mini chips 500' without dielectric openings 504 in the second dielectric layer 508 on the mini p-ohmic contacts and without p-bonding pads (see FIG. 9). Neighboring mini chips 500'c are partially covered by a single n-bonding pad 501. In other words, n-bonding pad 501 resides on top of the mini chips 500'c (6 of them in line illustrated in FIG. 8), with the second dielectric layer 508 inserted between n-bonding pad 501 and mini p-ohmic contacts 505 of the mini chips 500'c for electrical isolation. Specifically, n-bonding pad 501 is formed on the second dielectric layer 508 and contacts n-bridge 503 and/or mini n-contacts 506 of the mini chips 500'c through openings 510 in the second dielectric layer 508 and the first dielectric layer 507. In the embodiment shown in FIG. 9, n-bonding pad 501 contacts n-bridge 503 through openings 510, and n-bridge 503 contacts mini n-contacts 506 of the mini chips 500'c formed on the n-AlGaN structure 30. This is clearly revealed in the cross-sectional illustration taken along the AA' cut in FIG. 8, as shown in FIG. 9. The mini chips 500'c partially covered by n-bonding pad 501 can emit light as their mini p-ohmic contacts 505 are directly connected to the mini p-ohmic contacts 505 of the mini chips 500' to their left side. Another difference between chip 500 and chip 300 is in the p-bonding pad. As seen, in chip 300 each mini chip 300' has its own mini p-bonding pad 302. Chip 500 has a single large p-bonding pad 502, connecting to mini p-ohmic contacts 505 of all mini chips 500' through openings 504 in the second dielectric layer 508. Similar to the embodiment shown in FIG. 1, the regions in-between neighboring mini p-ohmic contacts 505 can be covered with first dielectric layer 507 for n-bridge metal 503 to run upon, forming an omnidirectional reflector to enhance light extraction efficiency for the LED. Thus, n-bridge metal 503 can be formed in the regions in-between neighboring mini p-ohmic contacts 505 in the form of network. A merged n-contact 506 is shared by four neighboring mini chips 500'.

Figure 10:
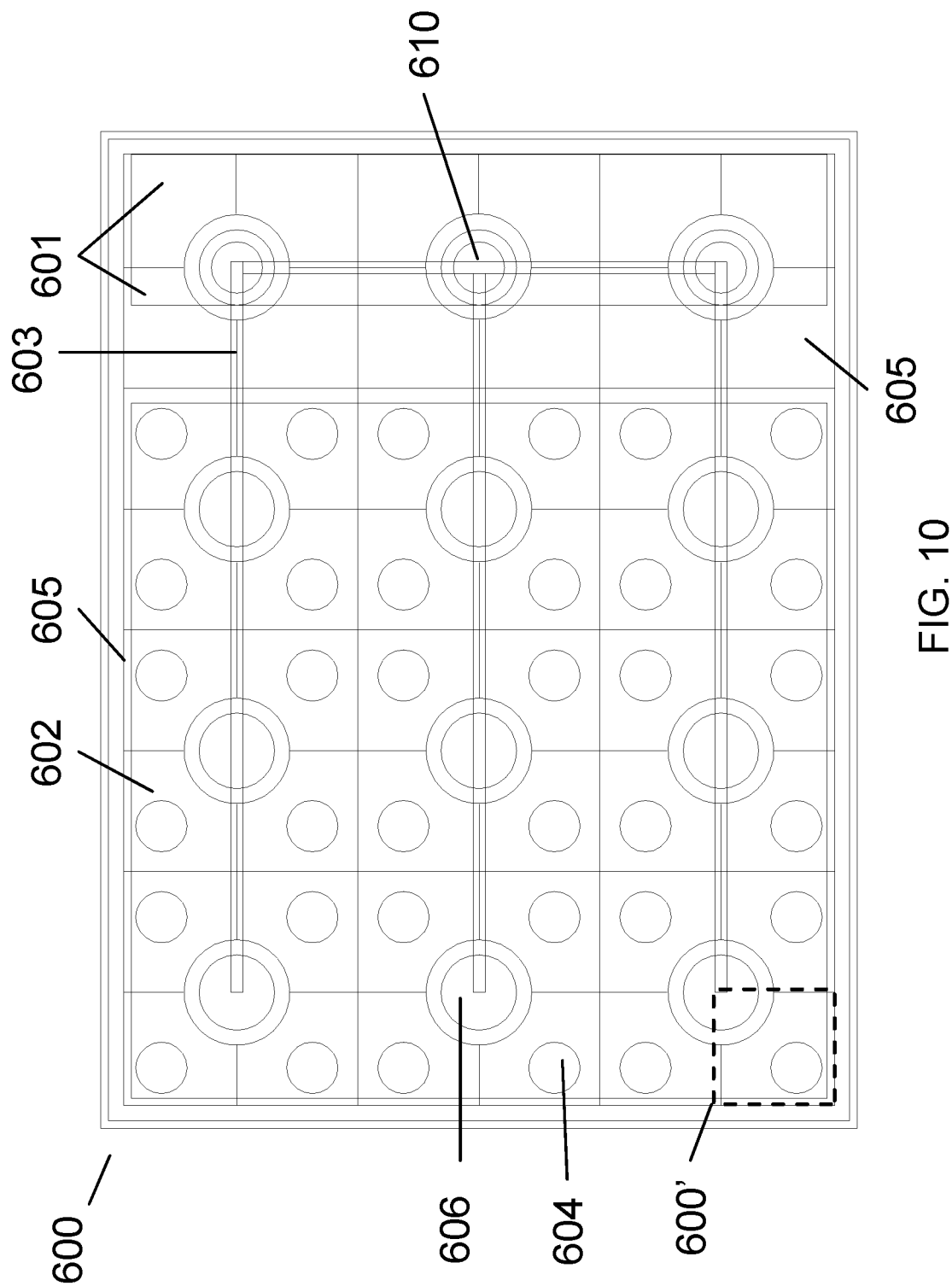
FIG. 10 illustrates a plan-view layout of a monolithic multiple-chip-collective light-emitting diode chip according to another embodiment of the present disclosure.

Chip 600 as illustrated in FIG. 10 is a modification of chip 500. Simply by merging all the discrete mini p-ohmic contacts 505 (in FIG. 8) into a continues large p-ohmic contact 605 (in FIG. 10), one turns chip 500 into chip 600. Chip 600 has the largest light-emitting area utilization efficiency. However, in this embodiment, as n-bridge metal 603 primarily runs on p-ohmic contact 605 and p-bonding pad 602, there is no light extraction benefit from reflective n-bridge metal 603. In other words, n-bridge metal 603 primarily is formed on p-ohmic contact 605 and p-bonding pad 602 with a dielectric layer (not shown in FIG. 10) inserted therebetween for isolation. N-bonding pad 601, openings 604 in the second dielectric layer, mini n-contact 606 and openings 610 in the second dielectric layer are similar to corresponding components of chip 500 in structure.

The present disclosure has been described using exemplary embodiments. However, it is to be understood that the scope of the present disclosure is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A monolithic multi-chip-collective light emitting diode comprising:
   an n-type structure, a p-type structure, and an active-region sandwiched between the n-type structure and the p-type structure;
   a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;
   an n-bridge metal electrically connecting the mini n-contact of each of the mini chips to an n-bonding pad, wherein the n-bridge metal is formed on the p-type structure and on sidewall of the opening in the p-type structure and the active-region, and the n-bridge metal does not electrically connect the mini n-contact of any of the mini chips to the mini p-ohmic contact of any of the mini chips.

2. The monolithic multi-chip-collective light emitting diode of claim 1, wherein a surface of the n-bridge metal facing the p-type structure is light reflective.

3. The monolithic multi-chip-collective light emitting diode of claim 1, further comprising a first dielectric layer formed on the p-type structure and on sidewall of the opening in the p-type structure and the active-region, and the n-bridge metal is formed on the first dielectric layer.

4. The monolithic multi-chip-collective light emitting diode of claim 3, wherein the first dielectric layer is UV transparent.

5. The monolithic multi-chip-collective light emitting diode of claim 1, wherein the monolithic multi-chip-collective light emitting diode is a high-power UV light emitting diode.

6. A monolithic multi-chip-collective light emitting diode comprising:
   an n-type structure, a p-type structure, and an active-region sandwiched between the n-type structure and the p-type structure;
   a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;
   an n-bridge metal electrically connecting the mini n-contact of each of the mini chips to an n-bonding pad, wherein the n-bridge metal is formed on the p-type structure and on sidewall of the opening in the p-type structure and the active-region;
   wherein the n-bridge metal comprises a light reflective layer facing the p-type structure, a diffusion blockage layer formed on the light reflective layer, a current conduction layer formed on the diffusion blockage layer, and an outer layer formed on the current conduction layer for adhesion to a dielectric layer.

7. The monolithic multi-chip-collective light emitting diode of claim 6, wherein the light reflective layer is made of aluminum or aluminum magnesium alloy and has a thickness equal to or greater than 10 nm.

8. The monolithic multi-chip-collective light emitting diode of claim 6, wherein the diffusion blockage layer is made of nickel and has a thickness in a range of 2-10 nm.

9. The monolithic multi-chip-collective light emitting diode of claim 6, wherein the outer layer is made of chromium, or palladium, or their alloy and has a thickness in a range of 1-10 nm.

10. A monolithic multi-chip-collective light emitting diode comprising:
    an n-type structure, a p-type structure, and an active-region sandwiched between the n-type structure and the p-type structure;
    a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;
    an n-bridge metal electrically connecting the mini n-contact of each of the mini chips to an n-bonding pad, wherein the n-bridge metal is formed on the p-type structure and on sidewall of the opening in the p-type structure and the active-region;
    wherein the n-bridge metal forms an omnidirectional reflector (ODR).

11. A monolithic multi-chip-collective light emitting diode comprising:
    an n-type structure, a p-type structure, and an active-region sandwiched between the n-type structure and the p-type structure;
    a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;

an n-bridge metal electrically connecting the mini n-contact of each of the mini chips to an n-bonding pad, wherein the n-bridge metal is formed on the p-type structure and on sidewall of the opening in the p-type structure and the active-region;

wherein the mini chips have the same size with a square or rectangular shape when viewed from top, the mini n-contact is formed at a corner of each of the mini chips, respectively, and corners of neighboring mini chips occupied by the mini n-contact are not adjacent to each other.

12. A monolithic multi-chip-collective light emitting diode comprising:

an n-type structure, a p-type structure, and an active-region sandwiched between the n-type structure and the p-type structure;

a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;

an n-bridge metal electrically connecting the mini n-contact of each of the mini chips to an n-bonding pad, wherein the n-bridge metal is formed on the p-type structure and on sidewall of the opening in the p-type structure and the active-region;

wherein the mini chips have the same size with a square or rectangular shape when viewed from top, every four neighboring mini chips have their respective mini n-contacts clustered and merged into a single mini n-contact at adjacent corners thereof.

13. The monolithic multi-chip-collective light emitting diode of claim 12, further comprising a plurality of medium mini chips, each of the medium mini chips being formed by joining the mini p-ohmic contacts of two or more neighboring mini chips, wherein neighboring medium mini chips are partially covered by the n-bonding pad.

14. The monolithic multi-chip-collective light emitting diode of claim 13, wherein mini p-ohmic contacts of the medium mini chips are electrically connected to the mini p-ohmic contacts of the mini chips.

15. The monolithic multi-chip-collective light emitting diode of claim 13, wherein the monolithic multi-chip-collective light emitting diode has a single large p-bonding pad, connecting to all the mini p-ohmic contacts.

16. The monolithic multi-chip-collective light emitting diode of claim 15, wherein the mini p-ohmic contacts of the mini chips are merged to form a single large p-ohmic contact.

17. A monolithic multi-chip-collective light emitting diode comprising:

an n-type structure, a p-type structure, and an active-region sandwiched between the n-type structure and the p-type structure;

a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;

an n-bridge metal electrically connecting the mini n-contact of each of the mini chips to an n-bonding pad, wherein the n-bridge metal is formed on the p-type structure and on sidewall of the opening in the p-type structure and the active-region; and a first dielectric layer formed on the p-type structure and on sidewall of the opening in the p-type structure and the active-region, and the n-bridge metal is formed on the first dielectric layer, wherein the first dielectric layer is UV reflective.

18. The monolithic multi-chip-collective light emitting diode of claim 17, wherein the first dielectric layer is a UV distributed Bragg reflector (DBR).

19. A monolithic multi-chip-collective light emitting diode comprising:

an n-type structure, a p-type structure, and an active-region sandwiched between the n-type structure and the p-type structure;

a plurality of monolithically integrated mini chips, wherein each of the mini chips comprises a mini n-contact formed on the n-type structure which is exposed by an opening in the p-type structure and the active-region, a mini p-ohmic contact formed on the p-type structure, and a mini light emitting area defined by the mini p-ohmic contact;

an n-bridge metal electrically connecting the mini n-contact of each of the mini chips to an n-bonding pad, wherein the n-bridge metal is formed on the p-type structure and on sidewall of the opening in the p-type structure and the active-region;

a first dielectric layer formed on the p-type structure and on sidewall of the opening in the p-type structure and the active-region, and the n-bridge metal is formed on the first dielectric layer; and a second dielectric layer and mini p-bonding pads of the mini chips, wherein the second dielectric layer is formed on the n-bridge metal, the mini p-ohmic contacts and the first dielectric layer, and the mini p-bonding pads contact the mini p-ohmic contacts through openings in the second dielectric layer, respectively.

20. The monolithic multi-chip-collective light emitting diode of claim 19, wherein each of the mini chips comprises a plurality of monolithically integrated micro chips, each of the micro chips has a micro n-contact, a micro p-ohmic contact defining a micro light emitting area, a micro p-bonding pad connecting to the micro p-ohmic contact via a micro opening in the second dielectric layer; wherein each of the mini chips contains a mini n-contact pad and a mini n-bridge metal, which forms a metal interconnection network connecting the mini n-contact pad to all micro n-contacts, the mini n-contact pad receives current from the n-bridge metal and distributes current via the mini n-bridge metal to all micro n-contacts.

* * * * *